United States Patent [19]

Canning et al.

[11] 3,997,856
[45] Dec. 14, 1976

[54] FREQUENCY DISCRIMINATOR CIRCUIT ARRANGEMENT

[75] Inventors: Jonathan Richard Canning, Burgess Hill; Gordon Arthur Wilson, Reigate, both of England

[73] Assignee: U.S. Philips Corporation, New York, N.Y.

[22] Filed: May 1, 1975

[21] Appl. No.: 573,476

[30] Foreign Application Priority Data

May 9, 1974 United Kingdom .......... 20448/74

[52] U.S. Cl. .............................. 333/17 R; 329/140; 325/349; 333/80 R
[51] Int. Cl.$^2$ ............................. H03H 7/10
[58] Field of Search .......... 333/17, 80 R; 329/119, 329/136, 138, 140–143; 325/349, 487

[56] References Cited
UNITED STATES PATENTS

| 2,911,527 | 11/1959 | Sontheimer | 329/140 X |
| 3,312,782 | 4/1967 | Wessels | 325/349 X |
| 3,778,644 | 12/1973 | Kohlhammer | 333/80 R X |
| 3,783,409 | 1/1974 | Polson, Jr. | 333/17 X |
| 3,873,923 | 3/1975 | Iten et al. | 325/349 X |

FOREIGN PATENTS OR APPLICATIONS 244,421  10/1969  U.S.S.R. .............. 325/349

*Primary Examiner*—Paul L. Gensler
*Attorney, Agent, or Firm*—Frank R. Trifari; Henry I. Steckler

[57] ABSTRACT

A circuit has two resonant circuits, each having an active element integrator on the same semiconductor chip. They can therefore have their resonant frequency controlled by the same control signal.

5 Claims, 1 Drawing Figure

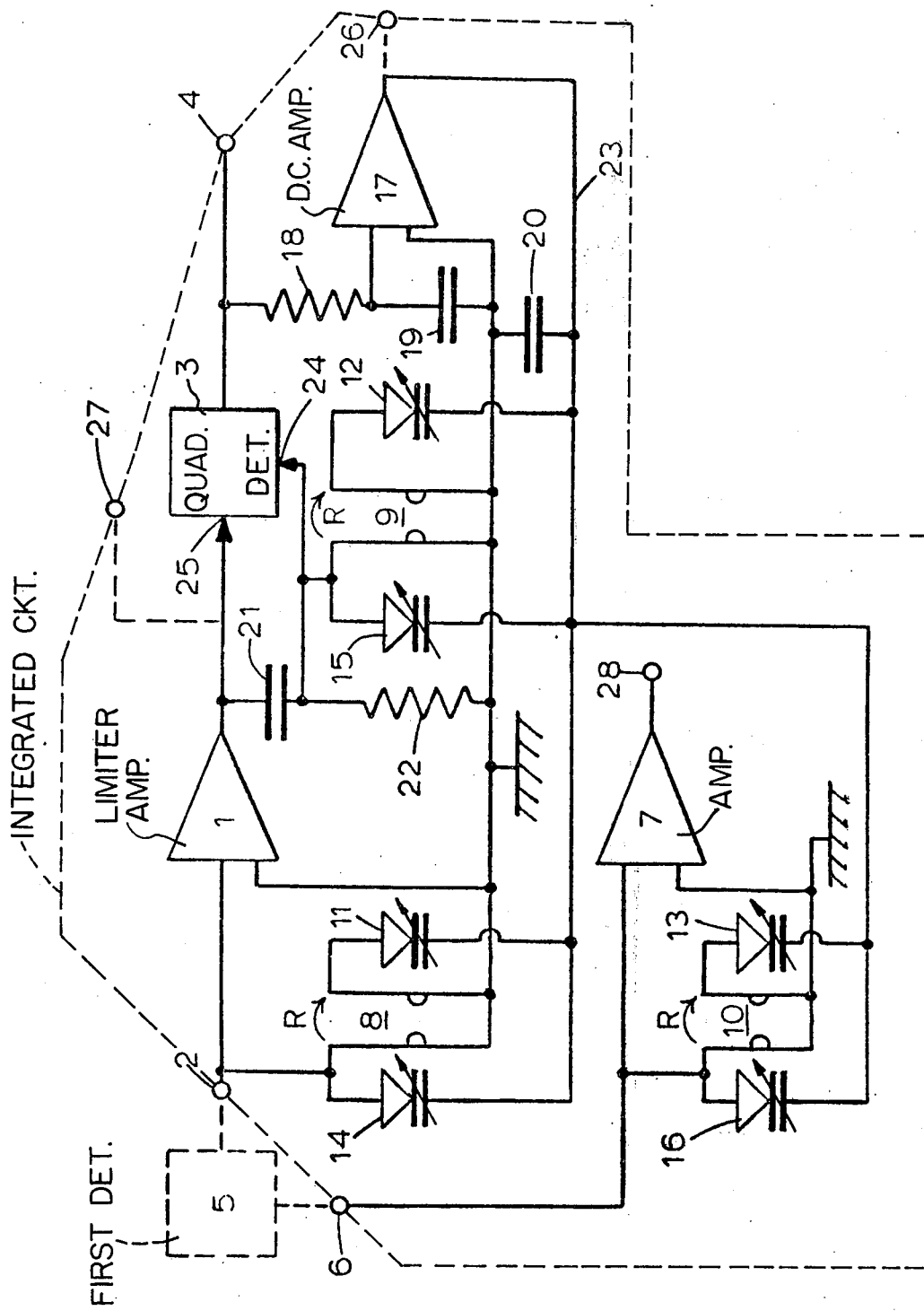

FREQUENCY DISCRIMINATOR CIRCUIT ARRANGEMENT

This invention relates to a circuit arrangement comprising a frequency discriminator for producing an output signal which depends on the sign of the deviation (if any) of the frequency of an input signal thereto from the resonant frequency of a resonant circuit inclued in said discriminator.

There is considerable interest at present in the idea of replacing conventional resonant circuits employing discrete inductors and capacitors by circuits which operate in a similar way but which do not include inductors as such. It has been known for some years that such replacement is possible, for example by employing an active circuit known as a gyrator as disclosed, for example in the article by Tellegen in Philips Research Reports 3, 81–100 (April 1948) and as discussed, for example, in Chapter 10 of the book "Analysis and Synthesis of Linear Active Networks" by S. K. Mitra. Recently this has become highly desirable because of the large-scale use of integrated circuitry, it being advantageous in apparatus employing integrated circuits to "integrate" as much of the circuit of the apparatus as possible, because this can result in a considerable cost saving. It is not possible to construct a discrete inductor in integrated circuit form, whereas it is possible to integrate a gyrator circuit having a capacitor across one of its ports, this having substantially the same properties as an inductor. A disadvantage of employing an integrated active resonant circuit, for example of the kind including a gyrator, is that the resonant frequency of the active circuit is liable to differ from that desired by an amount which is sufficient to necessitate its correction under operating conditions, for example by an operator adjusting the magnitude of a correcting voltage applied thereto. It is an object of the invention to mitigate this disadvantage.

The invention provides a circuit arrangement comprising a frequency discriminator for producing an output signal which depends on the sign of the deviation (if any) of the frequency of the input signal thereto from the resonant frequency of a resonant circuit included in said discriminator, said resonant frequency being adjustable by applying an adjusting signal to an adjusting signal input of said resonant circuit, and a coupling from an output of the discriminator to the adjusting signal input for applying a signal to said adjusting signal input dependent on the sign of said deviation to adjust said resonant frequency towards that of the input signal, said coupling including an integrator circuit.

The discriminator can thus be made to automatically adjust the frequency to which it is itself tuned so as to match more closely the frequency of the input signal thereto. This can be particularly advantageous if the inductive component of the resonant circuit is constituted by an active circuit such as a gyrator circuit having a capacitor connected across one of its ports.

The arrangement may include a further resonant circuit (which may be included in a channel for said input signal to the input of the discriminator) the resonant frequency of which is adjustable by applying an adjusting signal to an adjusting signal input of that further resonant circuit, a coupling including an integrator circuit being provided from an output of the discriminator to the adjusting signal input of the further resonant circuit for applying an adjusting signal thereto to adjust the resonant frequency of that further resonant circuit with the adjustment of the resonant frequency of the resonant circuit included in the discriminator. This can be particularly advantageous if the inductive components of the discriminator resonant circuit and the further resonant circuit are each constituted by an active circuit such as a gyrator circuit having a capacitor connected across one of its ports, and both of these active circuits are integrated on the same semiconductor chip, because in that case it is fairly easy to ensure that any deviation from the desired resonant frequency exhibited by one resonant circuit is accompanied by a corresponding deviation in the other and that the same value of adjusting signal is required to correct the resonant frequencies of both (even if the desired resonant frequencies differ from each other). The result of this is that the discriminator output can be used to match the frequencies of both the resonant circuits more closely to those of the input signals thereto.

An embodiment of the invention will be described more fully by way of example, with reference to the accompanying drawing, which is a diagram of part of the sound IF channel (up to and including the detector) of a colour television receiver, and part of the chrominance signal channel thereof.

In the drawing an IF amplifier for the 6MHz frequency-modulated sound carrier of a television receiver includes a limiting amplifier 1 fed from an input terminal 2, and a quadrature detector 3 which forms part of a frequency discriminator. An audio output signal can be taken from an output terminal 4.

The terminal 2 is fed with the frequency-modulated 6MHz sound carrier from the first detector 5 of the receiver, which also feeds a 4.43 MHz quadrature-modulated chrominance signal to an input 6 of an amplifier 7 the output of which is coupled to an output terminal 28.

The circuits shown include three parallel-resonant circuits each of which comprises a gyrator circuit (8, 9, 10 respectively) having a capacitor (11, 12, 13 respectively) connected across one of its ports, (which gyrator-capacitor combinations each effectively constitutes an inductance), capacitors 14, 15, 16 respectively being connected across the other ports of the gyrators to produce the parallel-resonant circuits. All of the components 8–16 are constructed in integrated circuit form on the same semi-conductor chip, preferably together with a d.c. amplifier 17, capacitors 19 and 20, and a resistor 18. Quadrature detector 3 and a capacitor 21 and a resistor 22 are also preferably provided in integrated circuit form on this chip, as are amplifiers 1 and 7 if practicable.

Parallel-resonant circuits 8, 11, 14 and 9, 12, 15 are constructed in known manner to be nominally resonant at 6MHz, and parallel-resonant circuit 10, 13,16 to be nominally resonant at 4.43MHz. Because the capacitors 11–16 are constructed as reverse-biased diodes the capacitances thereof, and hence the actual frequencies at which the various resonant circuits resonate, can be varied by varying the actual reverse bias on these diodes, by varying the potential on a line 23. Because components 8-16 are integrated on the same semiconductor chip it can be arranged that they are matched sufficiently well one to another that the same potential is required on the line 23 to bring each resonant circuit substantially exactly to its desired resonant frequency. This adjustment is achieved automatically as follows:

Resonant circuit 9, 12,15 is the resonant element of a frequency discriminator comprising this resonant circuit, quadrature detector 3, capacitor 21 and resistor 22. This discriminator operates in the usual way, the value of capacitor 21 being such (for example 10–15pF) that the signal which appears at its junction with resistor 22 and hence which is applied to input 24 of detector 3, is very nearly 90° out of phase with the signal applied to input 25 of detector 3, provided that these input signals are at the resonant frequency of the circuit 9, 12, 15. Any deviation of the frequency of the input signal from this frequency will result in an output appearing at terminal 4, this output having a sign which depends on the sign of the deviation. Thus when the resonant circuit 9, 12, 15 is resonant at 6MHz the output at terminal 4 will correspond to the frequency-modulation of the sound carrier only. The roll-off frequency of integrator circuit 18, 19 is chosen to be below the lowest frequency of this modulation, for example 30Hz, so that d.c. amplifier 17 is provided with zero input under these circumstances, with the result that zero signal results on line 23. (In fact line 23 is arranged to carry a steady d.c. bias to provide the nominal reverse bias for diodes 11–16). However, if the resonant frequency of 9, 12, 15 is different from the input frequency (which will also then be true of the resonant frequencies of resonant circuits 8, 11, 14 and 10, 13, 16) a d.c. component will appear at terminal 4, the sign of this component depending on whether the resonant frequency of 9, 12, 15 is above or below the input frequency. This d.c. component is then amplified by amplifier 17 and applied to line 23 so as to vary the capacitances of diodes 11–16 to bring the resonant frequencies of the various resonant circuits towards those of the input signals thereto. The amount of correction obtained will obviously depend on the gain in the feedback loop containing amplifier 17 to the diodes 12 and 15, the resonant frequency of circuit 9, 12,15 settling at a value which is offset from the input frequency thereto by an amount sufficient to maintain the necessary correcting bias on diodes 12 and 15. (If the output signal from the discriminator is sufficiently high amplifier 17 may be omitted).

Capacitor 20 is included to maintain some decoupling between the various components connected to line 23.

If desired the audio output may instead be taken from terminal 26, it then being necessary to increase the roll-off frequency of integrator circuit 18,19 to above the highest frequency, for example 20KHz, of the modulation of the sound carrier.

As a further alternative the circuit arrangement may be used with an amplitude-modulated sound or other carrier which will then have to be taken off prior to the quadrature detector, for example at terminal 27, and fed to an amplitude - demodulator (not shown).

If desired a form of frequency discriminator other than that including a quadrature detector may alternatively be used. For example a so-called "Foster Seeley" discriminator may be used, preferably with the discrete inductors normally used therein replaced by active circuits, for example gyrators each having a capacitor connected across one of its ports.

Although the circuit described employs active circuits instead of discrete inductors as its tuning elements it will be evident that conventional discrete inductors may alternatively be employed.

What we claim is:

1. A circuit comprising a frequency discriminator, said discriminator including an input means for receiving an input signal having a frequency, said discriminator further including a first resonant circuit having a first adjusting signal input means for changing the resonant frequency thereof, and said discriminator still further including an output means for providing an output signal in accordance with the sign of any deviation between said frequencies; said circuit further comprising an integrator means coupled between said output means and said first adjusting signal input means for changing said resonant frequency towards the input signal frequency; a second resonant circuit having a second adjusting signal input means, said second adjusting signal input means being coupled to said integrator means for changing the resonant frequency of said second circuit simultaneously with that of said first circuit; each of said resonant circuits being integrated on a single semiconductor chip and including active circuit inductive components.

2. A circuit as claimed in claim 1, wherein each of said active circuits comprise a gyrator circuit having a capacitor coupled across one port.

3. A circuit as claimed in claim 1, wherein the second resonant circuit is included in a channel for said input signal to the input means of the discriminator.

4. A circuit as claimed in claim 1, wherein the second resonant circuit has a resonant frequency substantially different from that of the first resonant circuit.

5. A circuit as claimed in claim 1, further comprising means for supplying a signal of predetermined frequency to said frequency discriminator.

* * * * *